United States Patent
Shibata et al.

(10) Patent No.: US 6,399,419 B1
(45) Date of Patent: Jun. 4, 2002

(54) PRODUCTION OF SEMICONDUCTOR DEVICE

(75) Inventors: Kazutaka Shibata; Shigeyuki Ueda, both of Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 09/604,747

(22) Filed: Jun. 28, 2000

Related U.S. Application Data

(63) Continuation of application No. 09/155,134, filed as application No. PCT/JP98/00281 on Jan. 22, 1998, now Pat. No. 6,133,637.

(30) Foreign Application Priority Data

Jun. 29, 1999 (JP) .......................................... 11-184185

(51) Int. Cl.$^7$ .......................... H01L 21/44; H01L 21/48; H01L 21/50
(52) U.S. Cl. ....................................... 438/108; 438/118
(58) Field of Search ................................. 438/108, 109, 438/118, 119, 614, 617, 113, 127, 151; 257/666, 686, 777, 779, 784, 795

(56) References Cited

U.S. PATENT DOCUMENTS 5,508,216 A * 4/1996 Inoue .......................... 438/151
6,133,637 A * 10/2000 Hikita et al. ................. 257/777

* cited by examiner

Primary Examiner—David Nelms
Assistant Examiner—Phuc T. Dang
(74) Attorney, Agent, or Firm—Rader, Fishman & Grauer, PLLC

(57) ABSTRACT

A method of opposing and joining a surface of a solid device and a surface of a semiconductor chip. A metal electrode portion formed in a raised state on the surface of the solid device and a metal electrode portion formed in a raised state on the surface of the semiconductor chip are directly abutted and pressed against each other. In the state, ultrasonic vibration is transmitted to the metal electrode portions which are pressed against each other, to join the metal electrode portions to each other.

5 Claims, 1 Drawing Sheet

PRODUCTION OF SEMICONDUCTOR DEVICE

This application is a continuation of U.S. application Ser. No. 09/155,134 (U.S. Pat. No. 6,133,637), filed Sep. 18, 1998, and claims the benefit of priority from 371 International Application No. PCT/JP98/00281, filed Jan. 22, 1998.

BACKGROUND OF THE INVENTION

1. Field of the Invention

The present invention relates to a method of mounting a semiconductor chip on a surface of a solid device with a face-down posture to produce a semiconductor device.

2. Description of Related Art

Known as a method of mounting a semiconductor chip on another semiconductor chip or a wiring board has been a face-down method for opposing and joining a surface of a semiconductor chip to a surface of a solid device such as another semiconductor chip or a wiring board.

On the surface of the semiconductor chip to be mounted by the face-down method, metal electrode portions called bumps are formed in a raised state. On the other hand, on the surface of the other semiconductor chip or the wiring board as a base, bumps are also formed at positions corresponding to the bumps formed on the semiconductor chip to be mounted. In mounting the semiconductor chip on the other semiconductor chip or the wiring board as the base, an anisotropic conductive film is interposed between the semiconductor chip and the semiconductor chip or the wiring board as the base. Thereafter, the bumps on the semiconductor chip and the bumps, which are opposed thereto, on the semiconductor chip or the wiring board as the base are pressed against each other.

The anisotropic conductive film has a structure in which conductive particles are dispersed in a resin film having adhesive properties. When the bumps which are opposed to each other with the anisotropic conductive film interposed therebetween are pressed against each other, therefore, the anisotropic conductive film is crushed between the bumps. Consequently, the bumps are bonded to each other by the resin film having adhesive properties, and conductive particles are sandwiched between the bumps, thereby achieving electrical connection between the bumps.

However, it takes relatively long for the anisotropic conductive film to be crushed between the opposed bumps, exhibiting the adhesive properties of the resin film in the anisotropic conductive film. Therefore, it takes relatively long for the step of mounting the semiconductor chip using the anisotropic conductive film.

When gold is used as a material for the bumps, it is considered that the bumps on the semiconductor chip and the bumps, which are opposed thereto, on the semiconductor chip or the wiring board as the base can be bonded to each other by being directly abutted and pressed against each other even if the anisotropic conductive film is not used. Consequently, it is possible to shorten time required for the step of mounting the semiconductor chip.

In this method, however, the opposed bumps may not be satisfactorily joined to each other if the surfaces of the bumps (a joint surface between the bumps) are dirty because an impurity layer adheres thereto.

SUMMARY OF THE INVENTION

An object of the present invention is to provide a method of producing a semiconductor device, which makes it possible to shorten time required for the step of producing the semiconductor device and to reliably bond a metal electrode portion on a semiconductor chip and a metal electrode portion on a solid device to each other.

The present invention relates to a method of opposing and joining a surface of a semiconductor chip to a surface of a solid device to produce a semiconductor device. The method according to the present invention comprises the steps of directly abutting and pressing a metal electrode portion formed in a raised state on the surface of the solid device and a metal electrode portion formed in a raised state on the surface of the semiconductor chip; and transmitting ultrasonic vibration to the metal electrode portions which are pressed against each other.

The solid device may be a semiconductor chip other than the semiconductor chip or a wiring board.

It is preferable that both the metal electrode portions which are respectively formed in a raised state on the surfaces of the solid device and the semiconductor chip are bumps composed of gold.

According to the present invention, the metal electrode portion formed on the surface of the semiconductor chip and the metal electrode portion formed on the surface of the solid device are bonded to each other by transmitting the ultrasonic vibration to a portion between the metal electrode portion on the semiconductor chip and the metal electrode portion on the solid device while pressing the metal electrode portions against each other.

When the metal electrode portion on the semiconductor chip and the metal electrode portion on the solid device are bonded to each other with an anisotropic conductive film interposed between the semiconductor chip and the solid device by the adhesive properties of the anisotropic conductive film, it takes approximately 20 seconds for the bonding. Contrary to this, in the method according to the present invention, when both the metal electrode portion on the semiconductor chip and the metal electrode portion on the solid device are composed of gold, time required to bond the metal electrode portion on the semiconductor chip and the metal electrode portion on the solid device is relatively short, for example, approximately 0.2 seconds. In the method according to the present invention, therefore, time required to produce the semiconductor device can be made shorter, as compared with that in the method of bonding the semiconductor chip and the solid device using the anisotropic conductive film.

Even if an impurity layer adheres to the surfaces of the metal electrode portions, the adhering impurity layer is torn by the transmission of the ultrasonic vibration. Consequently, metal atoms composing the metal electrode portions can be satisfactorily diffused between the metal electrode portions. Accordingly, it is possible to reliably bond the metal electrode portion on the semiconductor chip and the metal electrode portion on the solid device.

The ultrasonic vibration may be inputted to the semiconductor chip or the solid device. The ultrasonic vibration which has been inputted to the semiconductor chip or the solid device reaches a joint surface between the metal electrode portion on the semiconductor chip and the metal electrode portion on the solid device upon propagating through the semiconductor chip or the solid device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
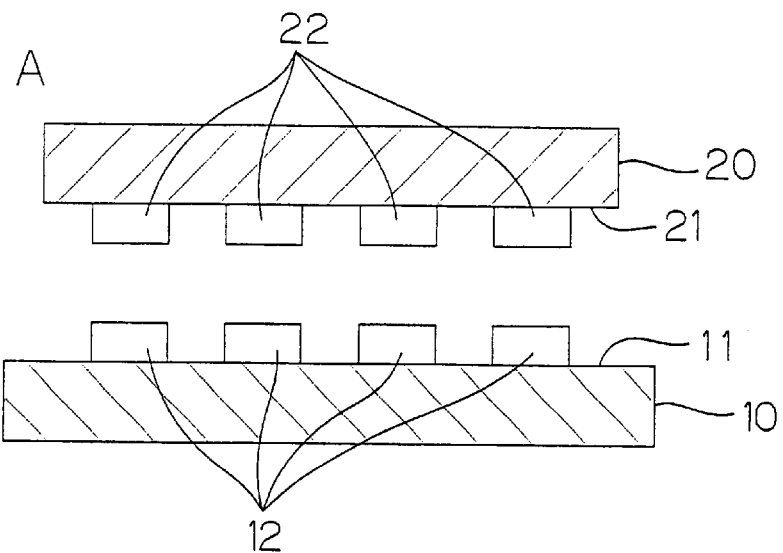
FIGS. 1A, 1B and 1C are illustrative cross-sectional views showing the steps of a method of producing a semiconductor device according to an embodiment of the present invention.
Figure 1B:
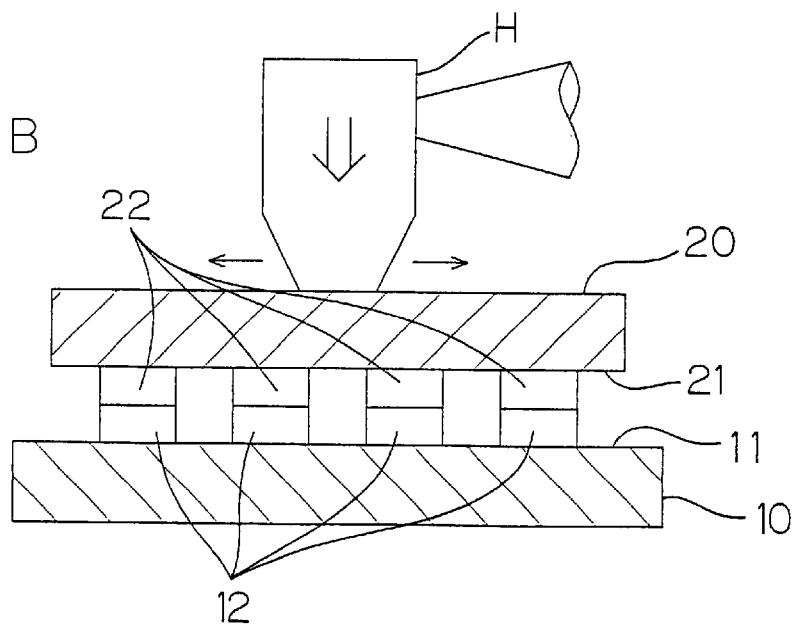
Figure 1C:
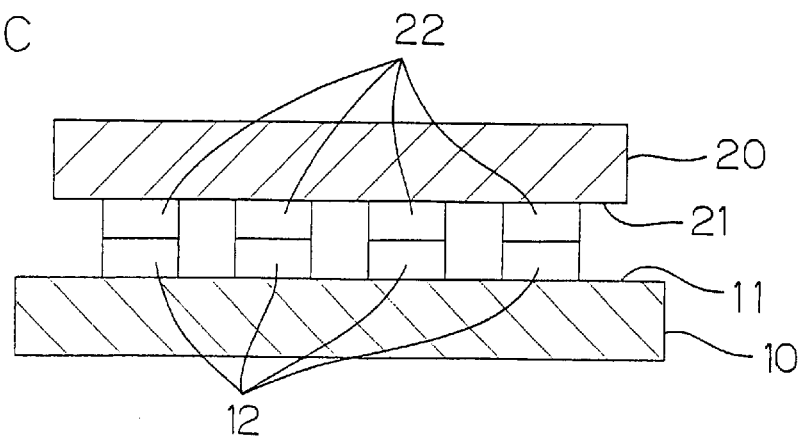

FIGS. 1A, 1B and 1C are illustrative cross-sectional views showing the steps of a method of producing a semiconductor device according to an embodiment of the present invention. The producing method shown in FIGS. 1A to 1C is a method of producing a semiconductor device having a chip-on-chip structure by mounting a secondary chip (daughter chip) 20 on a surface 11 of a primary chip (mother chip) 10 serving as a solid device by a face-down method.

The primary chip 10 and the secondary chip 20 are composed of silicon, for example. The surface 11 of the primary chip 10 is a surface, on the side of an active surface layer region on which functional devices such as a transistor forming an internal circuit are formed, of a semiconductor substrate forming a base body of the primary chip 10. The uppermost surface is covered with a protective film composed of an insulating material. Similarly, a surface 21 of the secondary chip 20 is a surface, on the side of an active surface layer region on which functional devices forming an internal circuit are formed, of a semiconductor substrate forming a base body of the secondary chip 20. The uppermost surface is covered with a protective film composed of an insulating material.

A plurality of bumps 12 composed of gold, for example, are formed in a raised state on the surface 11 of the primary chip 10. On the other hand, a plurality of bumps 22 composed of gold, for example, are formed in a raised state at positions, corresponding to the bumps 12 on the primary chip 10, on the surface 21 of the secondary chip 20. The bumps 12 and 22 can be formed by respectively forming openings in the protective films covering the uppermost surfaces of the primary chip 10 and the secondary chip 20 to expose internal wirings and then, gold-plating the exposed wirings.

The secondary chip 20 is mounted on the primary chip 10 by a so-called face-down method with the surface 21 on which the bumps 22 are formed directed toward the surface 11 of the primary chip 10.

Specifically, the primary chip 10 and the secondary chip 20 are aligned with each other such that the bumps 22 on the secondary chip 20 can be respectively abutted against the bumps 12 on the primary chip 10. Thereafter, the primary chip 10 and the secondary chip 20 are made to approach, to respectively abut the bumps 22 on the secondary chip 20 against the bumps 12 on the primary chip 10, as shown in FIG. 1A. The approaching step of the primary chip 10 and the secondary chip 20 may be carried out after aligning the primary chip 10 and the secondary chip 20, or may be carried out simultaneously with the alignment.

As shown in FIG. 1B, ultrasonic vibration at a predetermined energy is transmitted to the secondary chip 20 while pressing the secondary chip 20 against the primary chip 10 using a ultrasonic horn H. The ultrasonic vibration transmitted to the secondary chip 20 from the ultrasonic horn H propagates through the secondary chip 20, to reach a joint surface between the bump 22 on the secondary chip 20 and the bump 12 on the primary chip 10. Therefore, a shear force along the joint surface between the bump 22 on the secondary chip 20 and the bump 12 on the secondary chip 10 is exerted on the joint surface by the ultrasonic vibration in addition to a pressing force by pressing the secondary chip 20 . Even if an impurity layer adheres to surfaces of the bumps 12 and 22, the impurity layer is torn by the shear force, exposing the surfaces of the bumps 12 and 22. Consequently, the surface of the bump 12 and the surface of the bump 22 are directly brought into contact with each other, and gold which is a material composing the bumps 12 and 22 is satisfactorily diffused. Accordingly, the bump 12 and the bump 22 are bonded (ultrasonically welded). Time required for the bonding is relatively short, for example, approximately 0.2 seconds.

When the joining between the bump 12 on the primary chip 10 and the bump 22 on the secondary chip 20 using ultrasonic waves is thus completed, mounting of the secondary chip 20 on the primary chip 10 is achieved, as shown in FIG. 1C.

As described in the foregoing, according to the present embodiment, it is possible to bond the bump 12 on the primary chip 10 and the bump 22 on the secondary chip 20 to each other in a short time by transmitting the ultrasonic vibration to the joint surface between the bump 12 and the bump 22 while pressing the bump 22 against the bump 12 to directly bring the bumps into contact with each other. Accordingly, time required to produce the semiconductor device can be made shorter, as compared with that in the method of connecting the primary chip 10 and the secondary chip 20 with an anisotropic conductive film interposed therebetween.

Even if the impurity layer adheres to the surfaces of the bumps 12 and 22, the adhering impurity layer is torn by the transmission of the ultrasonic vibration. Consequently, gold composing the bumps 12 and 22 can be satisfactorily diffused between the bump 12 and the bump 22, thereby making it possible to reliably bond the bump 12 and the bump 22.

Although description has been made of one embodiment of the present invention, the present invention can be also embodied in another embodiment. Although both the primary chip 10 and the secondary chip 20 are assumed to be composed of silicon, for example, they may be semiconductor chips using another arbitrary semiconductor material such as a compound semiconductor (for example, a gallium arsenide semiconductor) or a germanium semiconductor in addition to silicon. In this case, a semiconductor material for the primary chip 10 and a semiconductor material for the secondary chip 20 may be the same or different from each other.

Although in the above-mentioned one embodiment, a case where the present invention is applied to a method of producing a semiconductor device having a chip-on-chip structure is taken as an example, the present invention is also applicable to a method of producing a semiconductor device having a flip-chip bonding structure for opposing and joining by a face-down method a surface of a semiconductor chip to a surface of a wiring board serving as a solid device.

Although the present invention has been described and illustrated in detail, it is clearly understood that the same is by way of illustration and example only and is not to be taken by way of limitation, the spirit and scope of the present invention being limited only by the terms of the appended claims.

The application claims the conventional priority benefits of Japanese Patent Application Serial No. 11-184185 filed with the Japanese Patent Office on Jun. 29, 1999, the disclosure of which is incorporated herein by reference.

What is claimed is:

1. A method of producing a semiconductor device, comprising the steps of:

opposing a surface of a solid device and a surface of a semiconductor chip;

directly abutting and pressing a first metal electrode portion formed in a raised state on the surface of said solid device against a second metal electrode portion formed in a raised state on the surface of the semiconductor chip; and transmitting ultrasonic vibration to the first and second metal electrode portions which are pressed against each other, to join the first and second metal electrode portions to each other.

2. The method according to claim 1, wherein said solid device is a semiconductor chip other than said semiconductor chip.

3. The method according to claim 1, wherein said solid device is a wiring board.

4. The method according to claim 1, wherein the metal electrode portions which are respectively formed in a raised state on the surfaces of said solid device and the semiconductor chip are bumps composed of gold.

5. The method according to claim 1, wherein said ultrasonic vibration is inputted to said semiconductor chip or the solid device, and is transmitted to a joint surface between the metal electrode portion on the semiconductor chip and the metal electrode portion on the solid device upon propagating through the semiconductor chip or the solid device.

* * * * *